United States Patent [19]

Bessolo et al.

[11] Patent Number: 5,229,635
[45] Date of Patent: Jul. 20, 1993

[54] ESD PROTECTION CIRCUIT AND METHOD FOR POWER-DOWN APPLICATION

[75] Inventors: Jeffrey M. Bessolo, Groton, Mass.; Gedaliahoo Krieger, Palo Alto, Calif.

[73] Assignee: VLSI Technology, Inc., San Jose, Calif.

[21] Appl. No.: 748,294

[22] Filed: Aug. 21, 1991

[51] Int. Cl.⁵ .................................. H01L 23/62
[52] U.S. Cl. .................... 257/360; 257/357; 257/361; 257/362
[58] Field of Search ............. 357/23.13, 35, 43; 257/357, 360, 361, 362

[56] References Cited

U.S. PATENT DOCUMENTS

| | | | |
|---|---|---|---|
| 4,609,931 | 9/1986 | Koike | 357/23.13 |
| 4,734,752 | 3/1988 | Kiu et al. | 357/23.4 |
| 4,763,184 | 8/1988 | Krieger et al. | 357/23.13 |
| 4,786,956 | 11/1988 | Puar | 357/23.13 |
| 4,819,047 | 4/1989 | Gilfeather et al. | 357/23.13 |
| 4,835,416 | 5/1989 | Miller | 357/23.13 |
| 4,855,620 | 8/1989 | Duvvury et al. | 357/23.13 |
| 4,868,705 | 9/1989 | Shiochi et al. | 357/23.13 |
| 4,870,530 | 9/1989 | Hurst et al. | 361/91 |
| 4,903,093 | 2/1990 | Ide et al. | 357/23.13 |
| 4,924,339 | 5/1990 | Atsumi et al. | 357/23.13 |
| 5,016,078 | 5/1991 | Tailliet | 357/86 |
| 5,028,819 | 7/1991 | Wei et al. | 357/23.13 |
| 5,032,742 | 7/1991 | Zanders | 357/23.13 |
| 5,099,302 | 3/1992 | Pavlin | 357/23.13 |

FOREIGN PATENT DOCUMENTS

| | | | |
|---|---|---|---|
| 61-248549 | 11/1986 | Japan | 357/23.13 |
| 1-130554 | 5/1989 | Japan | 357/35 |
| 1-286354 | 11/1989 | Japan | 357/23.13 |
| 2-238668 | 9/1990 | Japan | 357/23.13 |
| 2-294063 | 12/1990 | Japan | 357/35 |
| WO91/05371 | 4/1991 | PCT Int'l Appl. | 357/23.13 |

*Primary Examiner*—Rolf Hille
*Assistant Examiner*—Steven Loke
*Attorney, Agent, or Firm*—Patrick T. King

[57] ABSTRACT

A technique for providing electrostatic discharge (ESD) protection for an open-drain CMOS I/O buffer circuit having an output terminal. An NMOS enhancement-mode transistor has its drain connected to the VDD power bus for the buffer circuit, its source connected to the output terminal, and its gate connected to a noise-free internal VSS power bus (VSSI). The bulk region is connected to the VSS power bus (VSSE) for the I/O buffer circuit. ESD protection is provided by a parasitic lateral npn bipolar transistor that is inherent to the NMOS transistor. The parasitic lateral npn bipolar transistor has an emitter formed from the drain-to-bulk junction of the NMOS transistor, a collector formed from the source-to-bulk junction of the NMOS transistor, and a base formed in the bulk region.

4 Claims, 1 Drawing Sheet

ESD PROTECTION CIRCUIT AND METHOD FOR POWER-DOWN APPLICATION

BACKGROUND OF HE INVENTION

1. Field of the Invention

This invention relates to electro-static discharge (ESD) protection techniques and, more particularly, to techniques for providing ESD protection for I/O buffer transistor circuits having open-drain output terminals, even when the I/O buffer transistor circuits are powered down and the bus to which the I/O buffer transistor circuits are connected are active.

2. Prior Art

Conventional CMOS I/O pins contain ESD protection circuitry that clamps the I/O pin to within a diode voltage drop above VDD or below VSS. The protection circuitry makes use of the drain-to-bulk well diodes that are inherent in the structure of the NMOS and PMOS output transistors of the I/O buffer. During normal device operation, these diodes are reverse-biased unless externally applied signal voltages exceed the supply voltage range (VDD-VSS) of the buffer. When a device is powered off, the VDD and VSS pins are effectively at 0 volts, and any positive voltage transition applied to the I/O pins will be clamped by the diode protection circuitry that exits between the I/O pins and VDD pin of the device.

For an open-drain output configuration, only an NMOS pull-down transistor is provided with no complementary PMOS pull-up transistor being provided. In this case, an explicit p+/n− diode or a PMOS transistor (biased off) is usually added to provide EDS protection between the I/O and VDD pins.

Some systems are required to have ESD protection for their output terminals while still permitting the system to be in a powered-down state while the output bus is still active. However, any protection structure that creates a forward-biased diode when the I/O pin voltage is more positive than VDD will not satisfy the power-drown constraint mentioned previously. To satisfy the power-down requirements, prior art implementations utilize an open-drain I/O buffer with no ESD protection structure provided to VDD. This satisfies the power-down constraint but provides no ESD protection between the I/O terminal and the VDD bus.

A need exists for an electro-static discharge ESD protection circuit for a CMOS I/O buffer having an open-drain output.

SUMMARY OF THE INVENTION

It is therefore an object of the invention to provide ESD protection to an open-drain circuit which allows the buffer I/O terminal to be connected to an active system bus while allowing the buffer circuits to be powered off without clamping the bus to ground.

It is another object of the invention to provide ESD protection for a voltage applied between an open-drain I/O buffer and the VDD pins for the I/O buffer where the protection is comparable to that of a "standard" ESD protection circuit.

It is another object of the invention to provide ESD protection to an open-drain I/O buffer circuit while not degrading buffer performance under normal operating conditions while not adversely affecting the required DC specifications for I/O pin voltages and currents.

It is another object of the invention to provide ESD protection to the output terminal of an open-drain I/O buffer while not increasing the latch up susceptibility of the I/O pin.

In accordance with these and other objects of the invention, an electrostatic discharge (ESD) protection circuit for protecting a CMOS I/O buffer transistor circuit from electrostatic discharge voltages is provided The CMOS I/O buffer transistor circuit has an open-drain output terminal, which is connected to an I/O bonding pad. An NMOS enhancement-mode transistor is connected as follows: A drain terminal is connected to a VDD power bus which supplies the output transistors. A source terminal is connected to the I/O bonding pad. A gate terminal is connected to a noise-free internal VSS power bus (VSSI). A bulk region is connected to the VSS power bus (VSSE) supplying the output transistors. ESD protection is provided by a parasitic lateral npn bipolar transistor that is inherent to the NMOS transistor. The parasitic lateral npn bipolar transistor has an emitter formed from the drain-to-bulk junction of the NNOs transistor, the collector formed form the source-to-bulk junction of the NMOS transistor, and a base formed in the bulk region.

A method is provided for protecting an open-drain CMOS I/O buffer transistor circuit from electrostatic discharge (ESD) voltages, where the open-drain output terminal is connected to an I/O bonding pad. The method includes the step of connecting the drain terminal of an NMOS enhancement-mode transistor to a VDD power bus for the output transistors. The source terminal of the NMOS enhancement-mode transistor is connected to the I/O bonding pad. The gate terminal of the NMOS enhancement-mode transistor is connected to a noise-free internal VSS power bus (VSSI). The bulk region of the NMOS enhancement-mode transistor is connected to the VSS power bus (VSSE) supplying the output transistors. ESD protection is provided by a parasitic lateral npn bipolar transistor that is parasitic to the NMOS transistor where the lateral npn transistor is formed from the drain-to-bulk junction of the NMOS transistor and from the source-to-bulk junction of the NMOS transistor.

An advantage of the invention is its simplicity of construction. The protection structure is a single NMOS transistor that can be conveniently incorporated into an I/O buffer layout. Another advantage of the invention is it use of a known integrated-circuit structure with known operational characteristics, since similar structures are used to provide ESD protection between an I/O pin and VSS. Another advantage of the invention is that it has minimal effects on buffer performance characteristics. The high impedance of the off BNMOS eESD transistor has negligible impact on normal buffer operation and a slight increase in output capacitance can be minimized by careful layout techniques. Another advantage of the invention is that it has not external latch-up susceptibility. Because the I/O buffer structure is NMOS only, there are not external latch-up issues to consider such as required by complimentary CMOS I/O structures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
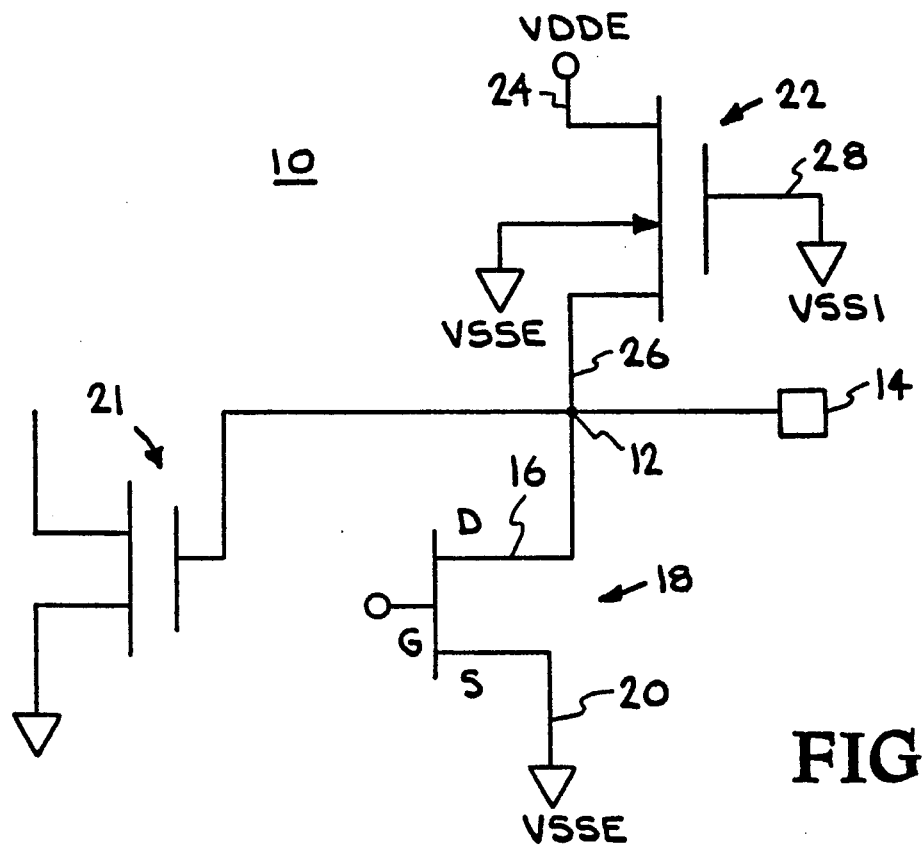
FIG. 1 is a circuit diagram for an NMOS transistor which provides ESD protection for transistors of an integrated circuit with an open-drain I/O buffer, where protection is obtained by providing a discharge path between the output terminal of the open-drain output device and the VDD power terminal.

FIG. 1 shows a circuit diagram of the output stage of an I/O buffer circuit 10 for an integrated circuit having a number of MOS transistors subject to damage by electro-static discharge. The buffer circuit 10 has an I/O output terminal 12 to which is connected a bonding pad 14. Also connected to the I/O output terminal 12 is the drain terminal 16 of an open-drain I/O buffer transistor 18. The source terminal 20 of the open-drain transistor 18 is connected to a VSSE voltage supply.

The integrated circuits includes a number of input transistors, typically represented by the transistor 21, which have their input gates connected to the I/O terminal 12. An electrostatic discharge (ESD) protections circuit for protecting the input transistors from electrostatic discharge voltages is provided by an NMOS enhancement-mode transistor 22. The drain germinal 24 of the NMOS enhancement-mode transistor 22 is connected to a VDD power bus which supplies the output transistor. A source terminal 26 of the NMOS enhancement-mode transistor 22 is connected to the I/O output terminal 12. A gate terminal 28 is connected to a noise-free internal VSS power bus (VSSI). the bulk region of the NMOS enhancement-mode transistor 22 is connected to the VSS power bus (VSSE) supplying the output transistors of the circuit.

Figure 2:
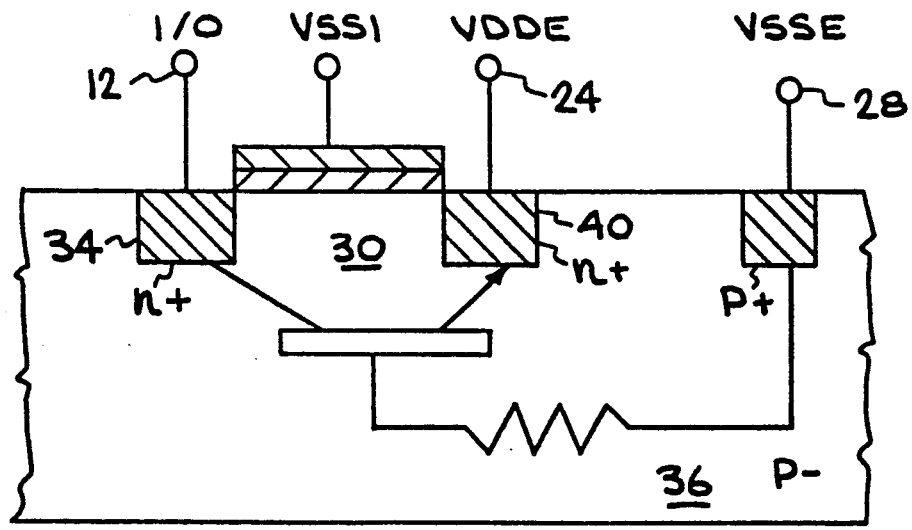
FIG. 2 shows the structure of an NMOS transistor having a parasitic lateral NPN transistor which is used for ESD protection of the integrated circuit by providing a discharge path between an open-drain output device and the VDD power terminal.

FIG. 2 shows in simplified form the structure of the semiconductor ESD device provided by the circuit configuration of FIG. 1. ESD protection is provided by a parasitic lateral npn bipolar transistor structure 30 that is inherent to the NMOS transistor 22 described in connection with FIG. 1. The lateral npn transistor 30 has a collector which is formed from the drain-to-bulk junction formed between the n+ doped source region 34 and the p− doped substrate bulk region 36 of the NMOS enhancement-mode transistor 22. The lateral npn transistor 30 has an emitter which is formed from the drain-to-bulk junction formed between the N+ doped drain region 40 and the p− doped substrate bulk region 36 of the NMOS enhancement-mode transistor 22.

When an ESD over-voltage is applied between the I/O terminal 12 and the VDD supply line connected to terminal 24, the parasitic lateral npn bipolar transistor 30 is turned on and the conduction of the parasitic npn transistor 30 provides a discharge path for the ESD current. This protects the thin high-impedance gate of the typical MOS transistor 21 from damage. Power can be removed from the buffer circuit and a bus connected to the I/O terminal 12 can still be active because the signal voltages on these elements do not affect operation of the parasitic lateral npn bipolar transistor 30 associated with the NMOS enhancement-mode transistor 22.

The size and physical layout of the NMOS transistor 22 is chosen to provide a sufficient parasitic conduction path between the I/O terminal 12 and the VDD supply. Previous characterization of test structures has shown that a transistor size of w/1=600 microns / 1.5 microns is sufficient to provide protection from ESD overvoltages in excess of 2 kv for a 1.0 micron CMOS process technology. In a specific implementation of the subject invention, the size and layout of the NMOS protection transistor was replicated for convenience from that used for an active pull-down transistor in an I/O buffer (w/1 =1200 micron / 1.8 micron). ESD tests performed on these devices has shown protection against overvoltages exceeding 4 kv.

The subject invention can be sued with any open-drain output or bidirectional buffer configuration.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to bet utilize the invention and various embodiments with various modifications as are suited to the particular use contemplated. It is intended that the scope of the invention be defined by the Claims appended hereto and their equivalents.

We claim:

1. An independent electrostatic discharge (ESD) protection circuit for protection a CMOS I/O buffer circuit from electrostatic discharge (ESD) voltages between an I/O bonding pad and the VDD power bus for the I/O buffer circuit comprising:

a separate NMOS enhancement-mode transistor structure providing a separate path for discharging ESD voltages between the I/O bonding pad and the VDD power bus said separate NMOS enhancement-mode transistor structure having the following connections: a drain terminal connected to a VDD power bus; a source terminal connected to the I/O bonding pad; a gate terminal connected to a VSS power bus; and a bulk region connected to the VSS power bus; and wherein said separate NMOS enhancement-mode transistor structure provides a separate parasitic lateral npn bipolar transistor for discharging ESD voltages between the I/O bonding pad and the VDD power bus, even when the CMOS I/O buffer circuit is powered down and when an external bus, to which the I/O bonding pad is connected, is active.

2. The ESD protection circuit of claim 1 wherein said CMOS I/O buffer transistor circuit has an open-drain output terminal, which is connected to the I/O bonding pad.

3. The ESD protection circuit of claim 1 wherein the NMOS enhancement-mode transistor structure is formed on a p-doped substrate and wherein the drain and the source are formed in n+ wells in said substrate.

4. The ESD protection circuit of claim 1 wherein the gate terminal of the NMOS enhancement-mode transistor structure is connected to a noise-free internal VSS power bus (VSSI) and the bulk region is connected to a VSS power bus for the output transistors driving the I/O buffer circuit.

* * * * *